United States Patent
Yan et al.

(10) Patent No.: US 10,128,218 B2
(45) Date of Patent: Nov. 13, 2018

(54) SEMICONDUCTOR DEVICE INCLUDING DIE BOND PADS AT A DIE EDGE

(71) Applicant: SANDISK SEMICONDUCTOR (SHANGHAI) CO., LTD., Shanghai (CN)

(72) Inventors: Junrong Yan, Shanghai (CN); Chee Keong Chin, Shanghai (CN); Chong Un Tan, Shanghai (CN); Ming Xia Wu, Shanghai (CN); Kim Lee Bock, Shanghai (CN); Shrikar Bhagath, San Jose, CA (US)

(73) Assignee: SanDisk Semiconductor (Shanghai) Co. Ltd., Shanghai (CN)

( * ) Notice: Subject to any disclaimer, the term of this patent is extended or adjusted under 35 U.S.C. 154(b) by 0 days.

(21) Appl. No.: 15/630,712

(22) Filed: Jun. 22, 2017

(65) Prior Publication Data
US 2018/0175006 A1  Jun. 21, 2018

(30) Foreign Application Priority Data
Dec. 20, 2016  (CN) .......................... 2016 1 1187727

(51) Int. Cl.
| | |
|---|---|
| H01L 23/482 | (2006.01) |
| H01L 25/065 | (2006.01) |
| H01L 23/00 | (2006.01) |
| H01L 21/78 | (2006.01) |
| H01L 23/58 | (2006.01) |

(52) U.S. Cl.
CPC .......... *H01L 25/0657* (2013.01); *H01L 21/78* (2013.01); *H01L 23/585* (2013.01); *H01L 24/06* (2013.01); *H01L 24/09* (2013.01); *H01L 24/48* (2013.01); *H01L 24/49* (2013.01); *H01L 24/04* (2013.01); *H01L 2224/06155* (2013.01); *H01L 2224/09151* (2013.01); *H01L 2224/48091* (2013.01); *H01L 2224/48145* (2013.01); *H01L 2224/48227* (2013.01); *H01L 2224/49112* (2013.01); *H01L 2224/49176* (2013.01); *H01L 2225/0651* (2013.01); *H01L 2225/06506* (2013.01); *H01L 2225/06527* (2013.01); *H01L 2225/06562* (2013.01)

(58) Field of Classification Search
CPC ........................... H01L 24/04; H01L 25/0657
USPC ........................................... 257/777; 438/462
See application file for complete search history.

(56) References Cited

U.S. PATENT DOCUMENTS

| | | | |
|---|---|---|---|
| 5,003,374 A * | 3/1991 | Vokoun, III | ........ H01L 21/3043 174/255 |
| 6,180,891 B1 | 1/2001 | Murdeshwar | |

(Continued)

OTHER PUBLICATIONS

U.S. Appl. No. 15/907,600, filed Feb. 28, 2018.

*Primary Examiner* — George Fourson, III
(74) *Attorney, Agent, or Firm* — Vierra Magen Marcus LLP

(57) ABSTRACT

A semiconductor device is disclosed that is formed with die bond pads at an edge of the semiconductor die. The die bond pads may be formed partially in a kerf area between semiconductor die on a wafer. When the wafer is diced, the die bond pads are severed along their length, leaving a portion of the die bond pads exposed at an edge of the diced semiconductor die. Having die bond pads at the edge of the die minimizes the offset between die when stacked into a package.

24 Claims, 10 Drawing Sheets

(56) References Cited

U.S. PATENT DOCUMENTS

| | | | |
|---|---|---|---|
| 7,517,726 B1* | 4/2009 | Tan | H01L 21/56 |
| | | | 257/678 |
| 8,203,215 B2 | 6/2012 | Sasaki et al. | |
| 2004/0043535 A1* | 3/2004 | Jeung | H01L 23/3114 |
| | | | 438/109 |
| 2006/0001144 A1* | 1/2006 | Uehling | H01L 23/585 |
| | | | 257/690 |
| 2008/0296570 A1 | 12/2008 | Chen et al. | |
| 2009/0026620 A1* | 1/2009 | Ohta | H01L 21/4857 |
| | | | 257/758 |
| 2009/0325344 A1 | 12/2009 | Takiar et al. | |
| 2016/0133585 A1 | 5/2016 | Kwon et al. | |
| 2017/0256509 A1* | 9/2017 | Lee | H01L 21/6836 |

* cited by examiner

SEMICONDUCTOR DEVICE INCLUDING DIE BOND PADS AT A DIE EDGE

BACKGROUND

The strong growth in demand for portable consumer electronics is driving the need for high-capacity storage devices. Non-volatile semiconductor memory devices, such as flash memory storage cards, are widely used to meet the ever-growing demands on digital information storage and exchange. Their portability, versatility and rugged design, along with their high reliability and large capacity, have made such memory devices ideal for use in a wide variety of electronic devices, including for example digital cameras, digital music players, video game consoles, PDAs and cellular telephones.

Semiconductor memory may be provided within a semiconductor package, which protects the semiconductor memory and enables communication between the memory and a host device. Examples of semiconductor packages include system-in-a-package (SiP) or multichip modules (MCM), where a plurality of die are mounted and interconnected on a small footprint substrate.

Semiconductor die are often stacked in a package in an offset stepped configuration, so that the die bond pads for each die in the stack are accessible for wire bonding. It has been found that as the number of die in a stack increase, warping of one or more upper die in the stack has been detected at the distal end of the one or more die (opposite the proximal ends including the die bond pads). In an offset stepped die stack, the distal ends of the die overhang the die below and are unsupported. This has resulted in the distal ends of one or more die at the top of the stack bending up away from the die stack.

DETAILED DESCRIPTION

The present technology will now be described with reference to the figures, which in embodiments, relate to a semiconductor die formed with die bond pads at an edge of the semiconductor die. In embodiments, the die bond pads may be formed partially in a kerf area between semiconductor die on a wafer. When the wafer is diced, for example in a stealth dice before grinding process, the die bond pads are severed, leaving a portion of the die bond pads exposed at an edge of the diced semiconductor die. Having die bond pads at the edge of the die minimizes the offset between die when stacked into a package. In addition to minimizing the footprint of the die stack, minimizing the die offset also minimizes warping of the one or more die at the top of the die stack.

It is understood that the present invention may be embodied in many different forms and should not be construed as being limited to the embodiments set forth herein. Rather, these embodiments are provided so that this disclosure will be thorough and complete and will fully convey the invention to those skilled in the art. Indeed, the invention is intended to cover alternatives, modifications and equivalents of these embodiments, which are included within the scope and spirit of the invention as defined by the appended claims. Furthermore, in the following detailed description of the present invention, numerous specific details are set forth in order to provide a thorough understanding of the present invention. However, it will be clear to those of ordinary skill in the art that the present invention may be practiced without such specific details.

The terms "top" and "bottom," "upper" and "lower" and "vertical" and "horizontal," and forms thereof, as may be used herein are by way of example and illustrative purposes only, and are not meant to limit the description of the technology inasmuch as the referenced item can be exchanged in position and orientation. Also, as used herein, the terms "substantially" and/or "about" mean that the specified dimension or parameter may be varied within an acceptable manufacturing tolerance for a given application. In one embodiment, the acceptable manufacturing tolerance is ±0.25%.

Figure 1:
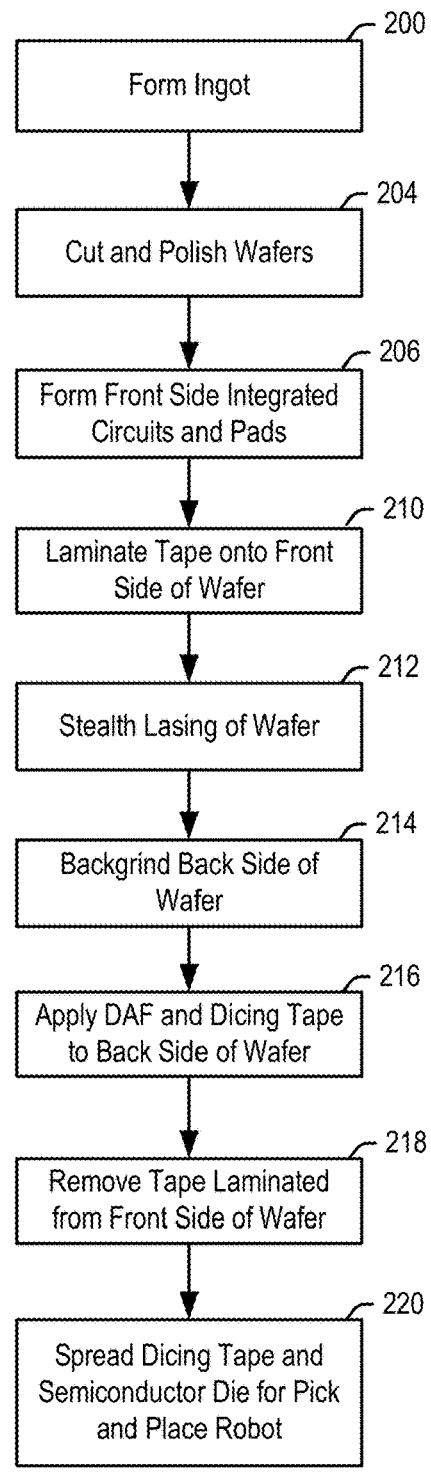
FIG. 1 is a flowchart for forming a semiconductor die according to embodiments of the present technology.

An embodiment of the present technology will now be explained with reference to the flowchart of FIG. 1, and the views of FIGS. 2-20. Referring initially to the flowchart of FIG. 1, a semiconductor wafer 100 may start as an ingot of wafer material which may be formed in step 200. In one example, the ingot from which the wafers 100 are formed may be monocrystalline silicon grown according to either a Czochralski (CZ) or floating zone (FZ) process. However, wafer 100 may be formed of other materials and by other processes in further embodiments.

In step 204, the semiconductor wafer 100 may be cut from an ingot and polished on both the first major surface 102 (FIG. 2), and second major surface 104 (FIG. 12) opposite surface 102, to provide smooth surfaces. In step 206, the first major surface 102 may undergo various processing steps to divide the wafer 100 into respective semiconductor die 106 (one of which is numbered in FIGS. 2 and 3), and to form integrated circuits of the respective semiconductor die 106 on and/or in the first major surface 102. These various processing steps may include metallization steps depositing metal contacts including die bond pads 108 (one of which is numbered in FIG. 2) exposed on the first major surface 102. The metallization steps may further include depositing metal interconnect layers and vias within the wafer. These metal interconnect layers and vias may be provided for transferring signals to and from the integrated circuits, and to provide structural support to the integrated circuits as explained below with respect to FIGS. 4-11.

Figure 2:
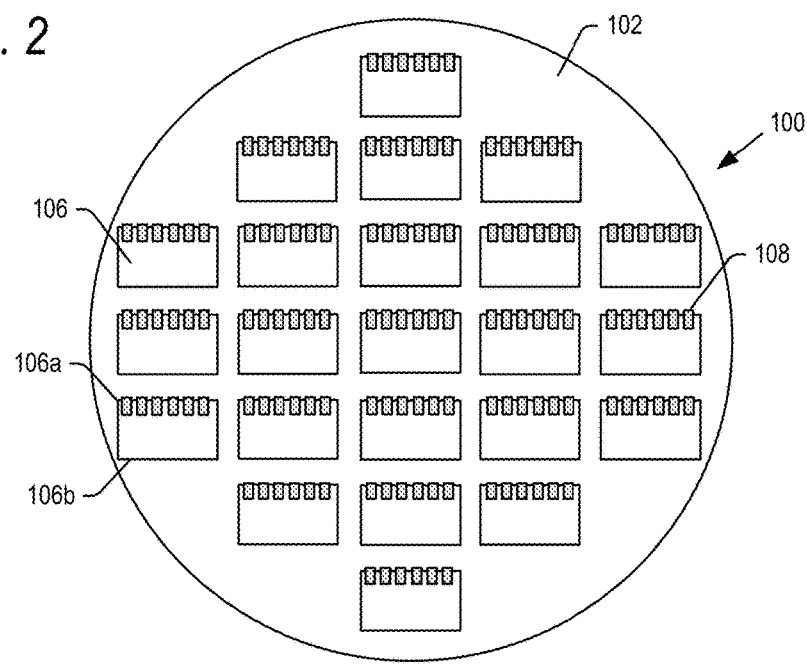
FIG. 2 is a front view of a semiconductor wafer showing a first major surface of the wafer.

The number of semiconductor die 106 shown on wafer 100 in FIG. 2 is for illustrative purposes, and wafer 100 may include more semiconductor die 106 than are shown in further embodiments. Similarly, the number of bond pads 108 on each semiconductor die 106 are shown for illustrative purposes, and each die 106 may include more die bond pads than are shown in further embodiments. Each semiconductor die 106 may include a proximal end 106a including the bond pads 108, and a distal end 106b opposite the proximal end 106a. The die bond pads 108 may for example be formed of aluminum, or alloys thereof, but the die bond pads 108 may be formed of other materials in further embodiments. In embodiments, the integrated circuits may operate as NAND flash memory semiconductor die, though other types of integrated circuits are contemplated.

Figure 3:
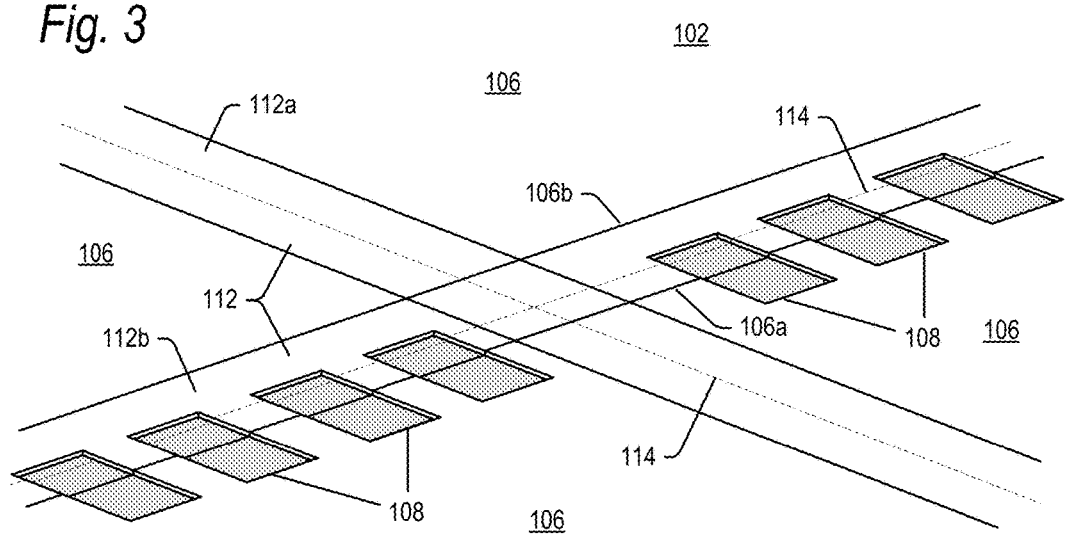
FIG. 3 is an enlarged view of a portion of the wafer showing die bond pads formed in a kerf area of the wafer.

In embodiments, each die bond pad 108 may have a length and width of approximately 70 μm, though the length and width may vary in further embodiments, proportionately or disproportionately to each other. In accordance with aspects of the present technology, die bond pads 108 may be formed at least partially within the a scribe area, or kerf area, provided between semiconductor die 106 on wafer 100. FIG. 3 is a perspective view showing a portion of the first major surface 102 of the wafer 100. The wafer 100 may include a kerf area 112 comprising vertically oriented kerf lines 112a and horizontally oriented kerf lines 112b. The kerf area 112 has been traditionally reserved as a border around active areas of the semiconductor die where a cut may be made to separate the semiconductor die from each other and the wafer 100. As such, the kerf area 112 has traditionally not formed part of the active area of semiconductor die 106 usable to form integrated circuits.

In some traditional dicing techniques such as sawing, material is removed from the wafer during the cut, and the cut is also not precisely controllable. As such, the kerf area 112 is traditionally larger than the area required to make the actual cut. Some wafer fabrication technologies provide for example a 70 μm kerf line width, while other wafer fabrication technologies provide for example a 170 μm kerf line width. The kerf lines 112a, 112b may have these or other widths in different embodiments.

As explained below, embodiments of the present technology use stealth dicing before grinding, which is a precise cutting method that removes little or none of the wafer when dicing the wafer. FIG. 3 further shows vertical and horizontal dicing lines 114 indicating the lines along which die 106 will be cut from wafer 100. As shown, the die 106 may be cut so that portions of the kerf lines 112a, 112b remain as a border around each semiconductor die.

In accordance with aspects of the present technology, a first portion of the die bond pads 108 may be formed within the usable area of the semiconductor die 106, and a second portion of the die bond pads 108 may be formed within the horizontal kerf lines 112b. The amount by which the die bond pads 108 extend into the horizontal kerf lines 112b may vary in embodiments, but is sufficient so that when the semiconductor die 106 are diced from the wafer 100, the dicing lines 114 pass through the second portion of the die bond pads 108 in the horizontal kerf lines 112b. In one example, one-half of the die bond pad may extend into the horizontal kerf lines 112b. If the die bond pads are 70 μm long, 35 μm may be formed in the horizontal kerf lines. However, this amount is provided by way of example only, and, as explained below, more of the die bond pads 108 may be formed in the horizontal kerf line 112b in further embodiments.

Thus, when the semiconductor die 106 are diced from the wafer 100 along the dicing cut lines 114, each of the die bond pads 108 are severed, leaving a portion of the die bond pads 108 exposed at the diced edge at the proximal end 106a of each semiconductor die 106. After dicing, a residual portion of each die bond pad 108 may remain unused in the distal end 106b of the semiconductor die 106.

In general, the second portion of the die bond pads 108 may extend less than half way into the horizontal kerf lines 112b. In such embodiments, the cut line 114 may be nearer to the semiconductor die proximal end 106a than to distal end 106b within the kerf lines 112b as shown in FIG. 3. In further embodiments, the second portion of the die bond pads 108 may extend more than halfway into the horizontal kerf lines 112b. In such embodiments, the cut line 114 may be nearer to the semiconductor die proximal end 106a as shown in FIG. 3, or the cut line 114 may be made down the middle of the horizontal kerf lines 112b.

Figure 4:
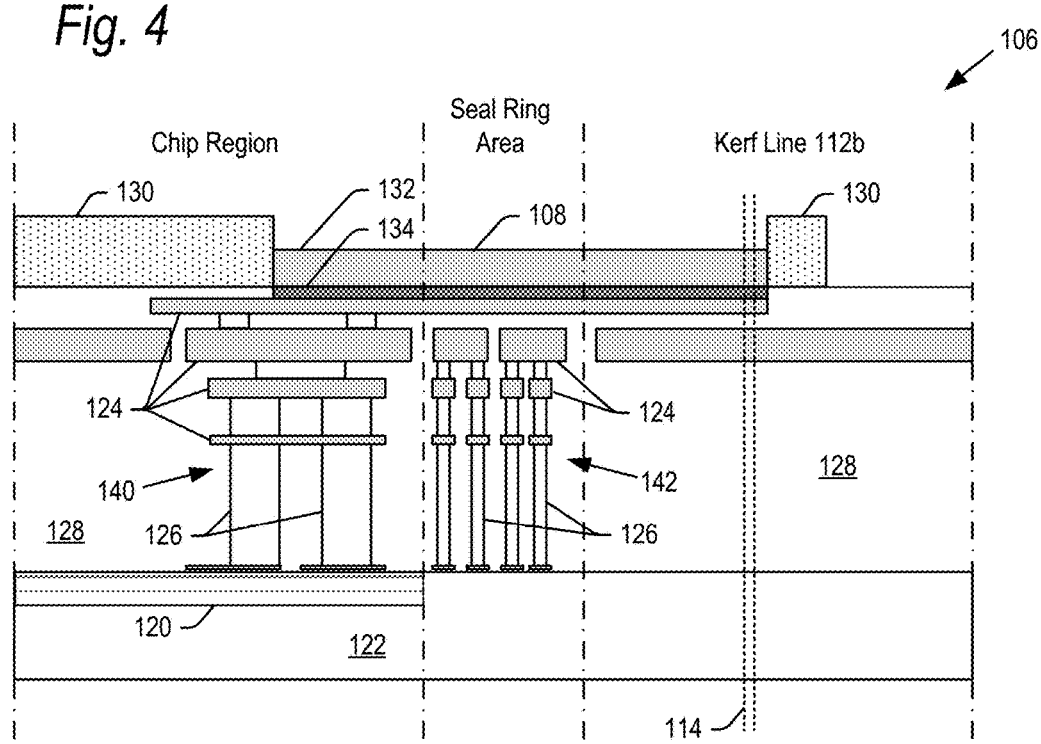
FIGS. 4 and 5 are cross-sectional edge and top views showing a die bond pad and internal components within the wafer according to a first embodiment.
Figure 5:
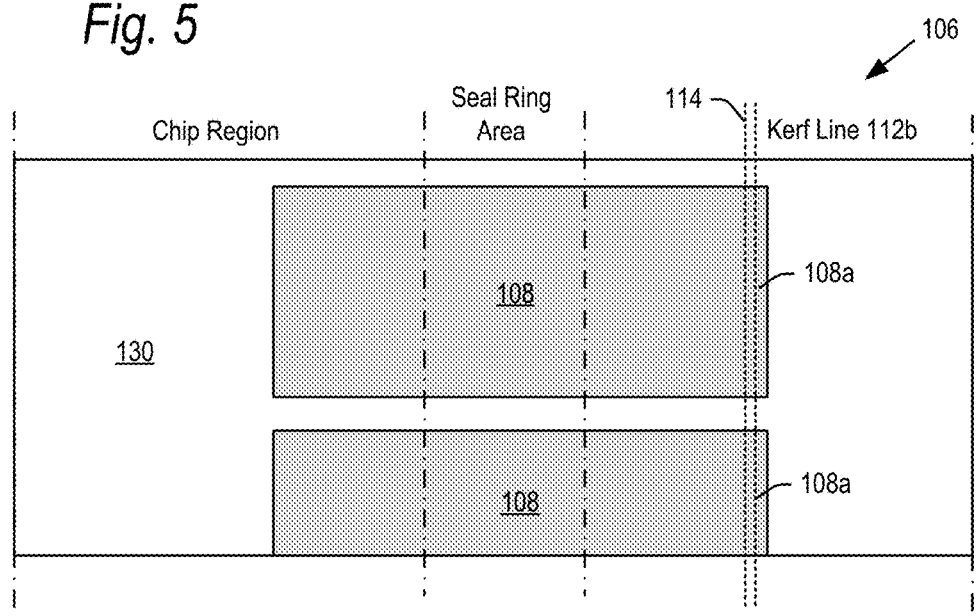

FIGS. 4 and 5 are cross-sectional side and top views of the wafer 100 at the proximal ends 106a of the semiconductor die 106 shown for example in FIG. 3. Each semiconductor die 106 may include integrated circuits 120 formed in and/or on a substrate layer 122 within a chip region of the semiconductor wafer. After formation of the integrated circuit 120, multiple layers of metal interconnects 124 and vias 126 may be formed sequentially in layers of a dielectric film 128. As is known in the art, the metal interconnects 124, vias 126 and dielectric film layers 128 may be formed a layer at a time using photolithographic and thin-film deposition processes. The photolithographic processes may include for example pattern definition, plasma, chemical or dry etching and polishing. The thin-film deposition processes may include for example sputtering and/or chemical vapor deposition. The metal interconnects 124 may be formed of a variety of electrically conductive metals including for example copper and copper alloys as is known in the art, and the vias may be lined and/or filled with a variety of electrically conductive metals including for example tungsten, copper and copper alloys as is known in the art.

A passivation layer 130 may be formed on top of the upper dielectric film layer 128. The passivation layer 130 may be etched to form the die bond pads 108. Each die bond pad 108 may include a contact layer 132 formed over a liner 134. As is known in the art, the contact layer 132 may be formed for example of copper, aluminum and alloys thereof, and the liner 134 may be formed for example of a titanium/titanium nitride stack such as for example Ti/TiN/Ti, though these materials may vary in further embodiments. The bond pads 108 (contact layer plus liner) may have a thickness of 720 nm, though this thickness may be larger or smaller in further embodiments.

The metal interconnects 124 and vias 126 may be used to form conductive nodes 140 as is known in the art within the chip region for transferring signals and voltages between the die bond pads 108 and integrated circuits 120. The metal interconnects 124 and vias 126 may also be used to form a seal ring 142 as is known in the art within a seal ring area. The seal ring 142 may surround the integrated circuits 120 and conductive nodes 140, and provide mechanical support to prevent damage to the integrated circuits 120 and conductive nodes 140 for example during dicing of the wafer 100.

In the embodiments of FIGS. 3-5, the die bond pads 108 are formed partially in the chip regions, seal ring areas and horizontal kerf lines 112b on wafer 100. The chip regions and seal ring areas may together be referred to herein as the active area of a semiconductor die 106. FIGS. 3-5 also show dicing line 114 representing a line along which the semiconductor die 106 are cut from wafer 100. As shown, the dicing line 114 cuts through the die bond pads 108 to leave an edge of the die bond pads 108 exposed at the edge of each semiconductor die 106 upon dicing from wafer 100. This exposed edge of the die bond pads 108 may be referred to herein as edge 108a. In one embodiment, the die bond pads 108 may be severed 1 μm to 5 μm from a proximal edge of the die bond pads, though the cut may be made closer or farther from the proximal edge of the die in further embodiments.

Figure 6:
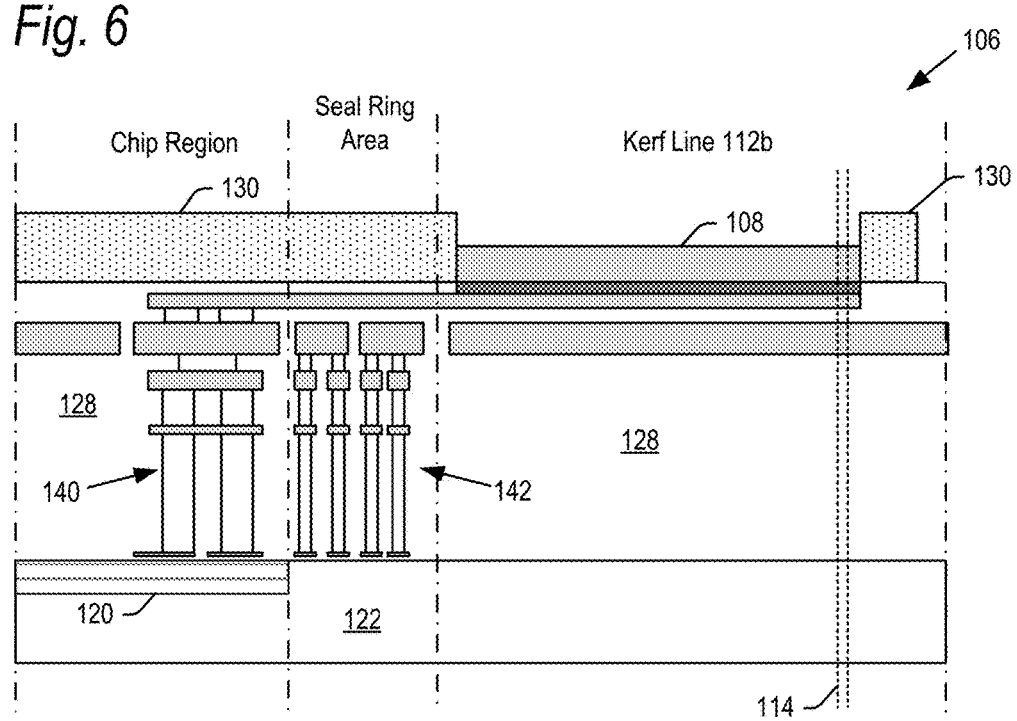
FIGS. 6 and 7 are cross-sectional edge and top views showing a die bond pad and internal components within the wafer according to a second embodiment.
Figure 7:
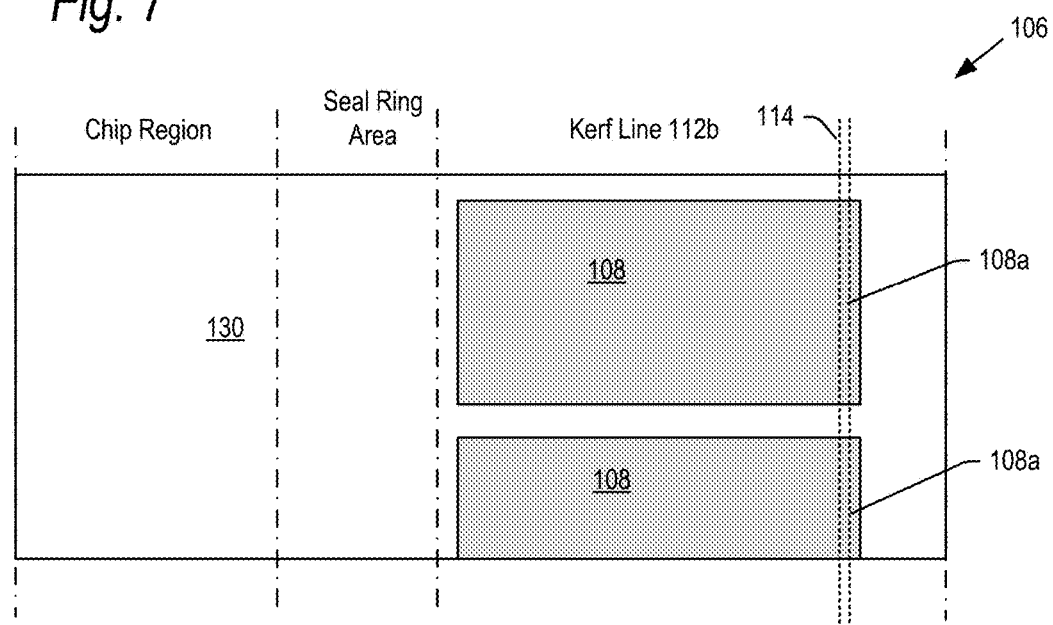

FIGS. 6 and 7 are cross-sectional and top views of a further embodiment of the present technology. In this embodiment, each semiconductor die 106 may include metal interconnects 124 and vias 126 forming the conductive nodes 140 and seal rings 142 as described above. However, in this embodiment, the die bond pads 108 are formed within the passivation layer 130 entirely within the horizontal kerf lines 112b on wafer 100. A portion of the passivation layer 130 may also extend into the horizontal kerf lines 112b, though it need not in further embodiments. In this embodiment, the die bond pads 108 may have the same length as in the embodiment of FIGS. 4 and 5, or the die bond pads 108 may have different lengths, such as for example shorter.

FIGS. 6 and 7 also show dicing line 114 representing the line along which the semiconductor die 106 are cut from wafer 100. As shown, the dicing line 114 cuts through the die bond pads 108 to leave the edge 108a of the die bond pads 108 exposed at the edge of each semiconductor die 106 upon dicing from wafer 100.

Figure 8:
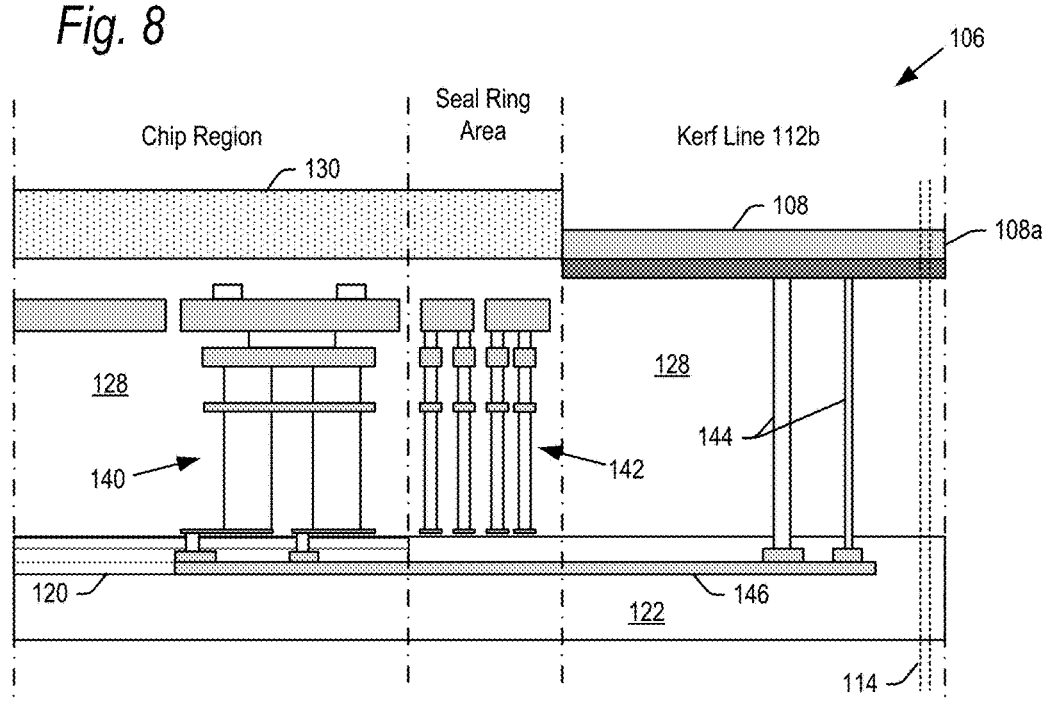
FIGS. 8 and 9 are cross-sectional edge and top views showing a die bond pad and internal components within the wafer according to a third embodiment.
Figure 9:
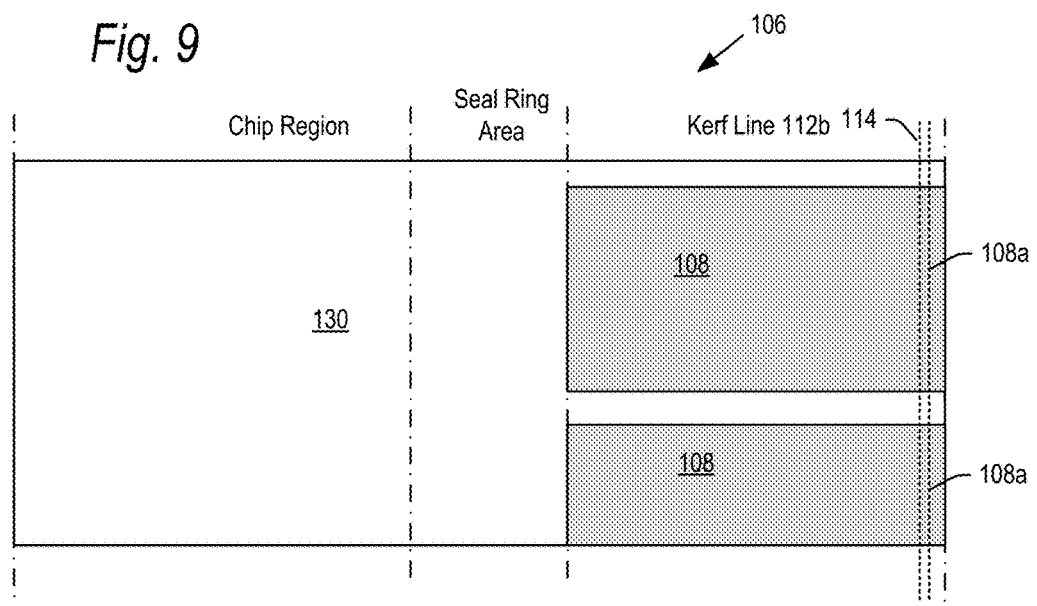

FIGS. 8 and 9 are cross-sectional and top views of a further embodiment of the present technology. In this embodiment, each semiconductor die may include the conductive nodes 140 and seal rings 142 as described above, and a die bond pad 108 formed entirely within the horizontal kerf lines 112b as described above. However, in the embodiment of FIGS. 8 and 9, the die bond pads 108 are electrically connected to the conductive nodes 140 through vias 144 and metal interconnects 146. As shown, the vias 144 may be formed extending down through all dielectric film layers 128 and into the substrate layer 122. Metal interconnects 146 may be formed within the substrate layer 122 extending between the vias 144 and metal interconnects of the conductive nodes 140, beneath the seal rings 142. In this embodiment, the passivation layer 130 may or may not extend into the horizontal kerf lines 112b. In this embodiment, the die bond pads 108 may have the same length as in the embodiment of FIGS. 4 and 5, or the die bond pads 108 may have different lengths, such as for example shorter.

FIGS. 8 and 9 also show dicing line 114 representing the line along which the semiconductor die 106 are cut from wafer 100. As shown, the dicing line 114 cuts through the die bond pads 108 to leave the edge 108a of the die bond pads 108 exposed at the edge of each semiconductor die 106 upon dicing from wafer 100.

Figure 10:
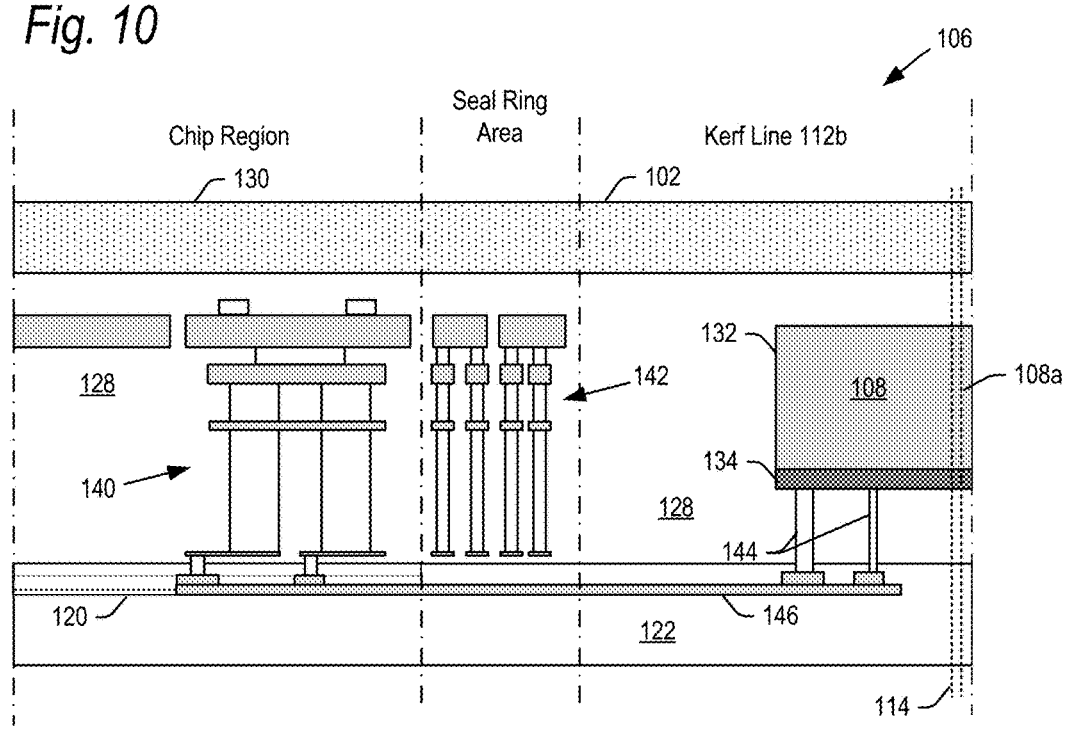
FIGS. 10 and 11 are cross-sectional edge and top views showing a die bond pad and internal components within the wafer according to a fourth embodiment.
Figure 11:
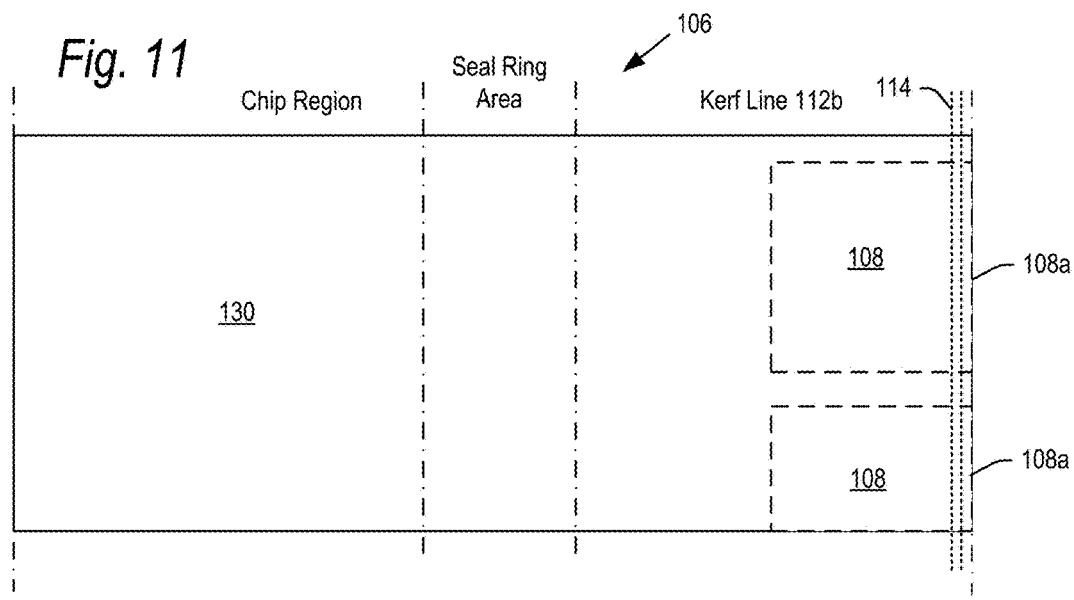

FIGS. 10 and 11 are cross-sectional and top views of a further embodiment of the present technology. In this embodiment, each semiconductor die may include the conductive nodes 140 and seal rings 142 as described above, and die bond pads 108 formed entirely within the horizontal kerf lines 112b. However, in this embodiment, the die bond pads 108 may be formed entirely beneath the major surface 102 of the wafer 100. In this embodiment, the passivation layer 130 may be a continuous (uninterrupted) layer on the surface 102 of the wafer 100. The die bond pads 108 may be formed entirely within the dielectric film layers 128 beneath the passivation layer 130.

In this embodiment, the exposed edges 108a of die bond pads 108 are the only portions of the die bond pads 108 used for electrical connection to the semiconductor die 106 within a semiconductor package as explained below. As such, the die bond pads 108 may be formed entirely within the horizontal kerf lines 112b, having a shorter length than the die bond pads 108 in the embodiments of FIGS. 4-9. However, the die bond pads 108 in the embodiment of FIGS. 10 and 11 may have the same length as the die bond pads 108 in the embodiments of FIGS. 4-9. The contact layer 132 is shown as having a greater thickness than in previously described embodiments, but the thickness of contact layer 132 may alternatively be the same as earlier described embodiments.

Upon dicing of the semiconductor die 106 from the wafer 100 along dicing lines 114, the die bond pads 108 are severed to leave the edge 108a of the die bond pads 108 exposed at the edge of each semiconductor die 106 upon dicing from wafer 100. However, in this embodiment, the edges 108a of the die bond pads 108 are beneath the surface of semiconductor die 106, between the major surfaces 102 and 104.

In the embodiment of FIGS. 10 and 11, the die bond pads 108 may include contact layers 132 formed over liners 134 as described above. Additionally, the die bond pads 108 may be electrically connected to the conductive nodes 140 through vias 144 and metal interconnects 146 formed down through one or more dielectric layers 128 into substrate layer 122 beneath the seal rings 142 as described above with respect to FIGS. 8 and 9. Alternatively, metal interconnects 124 and vias 126 may be provided within dielectric film layers 128 connecting the die bond pads 108 to the conductive nodes 140 above the seal rings 142 in further embodiments.

After formation of the integrated circuits 120 and metal conducting layers in step 206, a layer of tape may be laminated onto the major surface 102 in step 210. The wafer 100 may then be turned over, and diced in step 212. Embodiments of the present technology dice the wafer 100 using a stealth dicing before grinding step, which will now be explained with reference to FIGS. 12 and 13. The wafer 100 may be supported on a chuck or other support surface (not shown) with the second major surface 104 facing away from the support surface. A laser 150 may then emit a pulsed laser beam 152 at a wavelength that transmits through the second major surface 104 of the wafer 100, for example at infrared or near-infrared wavelengths. The pulsed laser beam may be focused to a point beneath the wafer's surface 104 using an optical system, for example including one or more collimating lenses 156. When the laser beam hits a peak power density at the focal point, the wafer absorbs the energy, and a pinpoint hole 160 is created beneath the wafer's surface.

Figure 12:
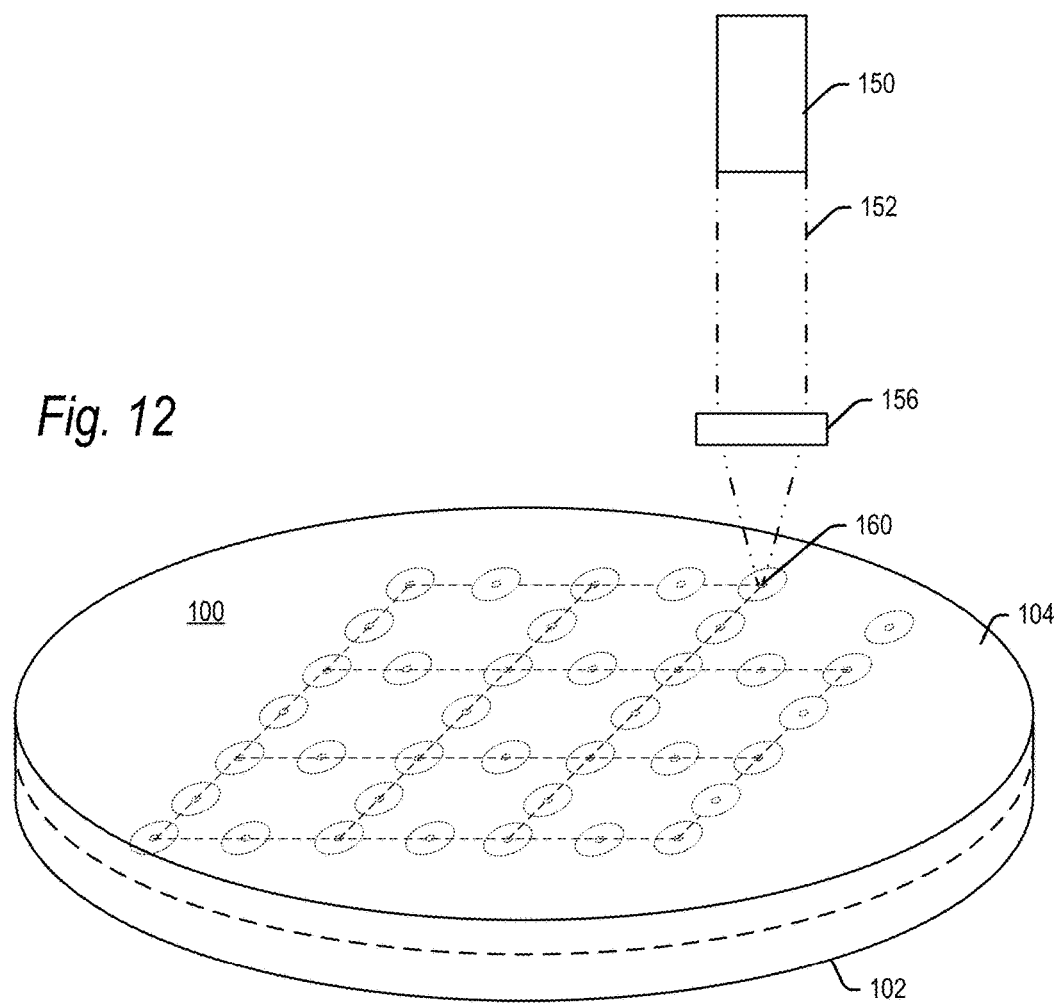
FIGS. 12 and 13 illustrate a stealth dicing before grinding laser process for dicing a semiconductor wafer.
Figure 13:
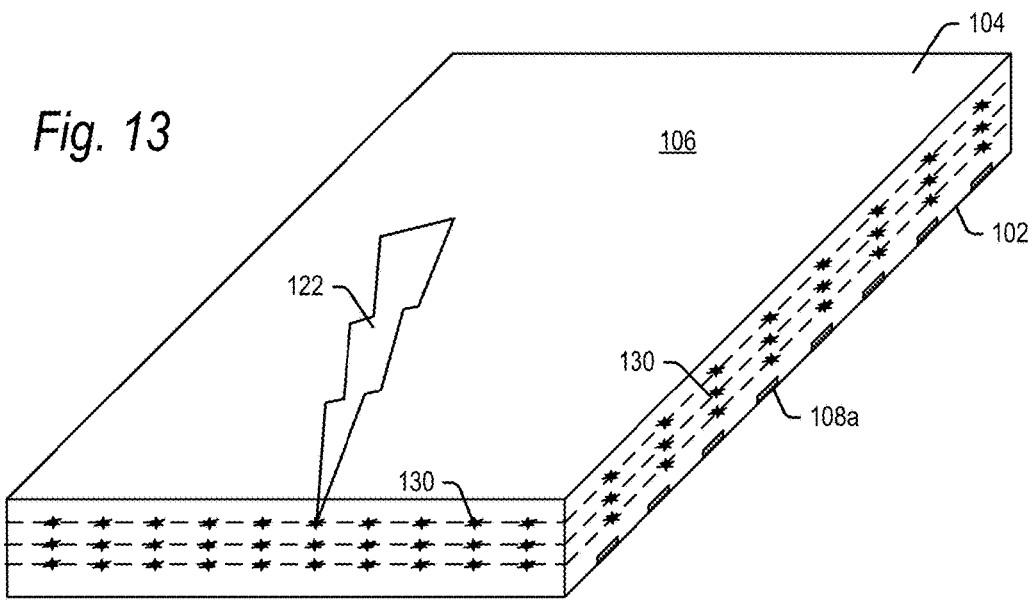

The laser may be moved along the kerf lines 112a and 112b in a plane of the wafer and activated at a number of points so that a number of closely situated pinpoint holes 160 are formed at an intermediate depth of the wafer (between the first and second major surfaces 102, 104 of the wafer). The rows and columns of pinpoint holes 160 define the eventual shape of each semiconductor die 106 to be diced from wafer 100 as indicated by FIGS. 12 and 13. The laser 150 is shown as having created layers of pinpoint holes 160 at three different depths of the wafer 100 in FIG. 13, but the laser may form one or more layers of pinpoint holes 160 at one or more depths in further embodiments. While FIG. 13 appears to show a diced semiconductor die 106, the die 106 may still be part of wafer 100 while the stealth dicing process is performed (and individual pinpoint holes 160 would not be visible to the eye upon inspection of wafer 100).

After the stealth dicing step 212, the wafer 100 may be diced or partially diced. The wafer may then be thinned in step 214 using a grinding wheel (not shown) applied to the second major surface 104. The grinding wheel may thin the wafer 100 from, for example, 780 µm to its final thickness of for example about 25 µm to 36 µm. It is understood that the wafer 100 may be thinner or thicker than this range after the backgrind step in further embodiments. In addition to thinning the wafer 100, the vibrations from the backgrind step may cause cracks at the pinpoint holes 160 to propagate toward the first and second major surfaces 102, 104 of the wafer 100 to complete the dicing along dicing lines 114 of any semiconductor die not fully diced after the stealth dice before grinding step.

It is understood that the wafer may be diced by methods other than stealth dice before grinding in further embodiments, including for example by saw, laser or waterjet cutting methods. In such embodiments, the wafer may be diced before or after the backgrind step.

After completion of the dicing step 212 and backgrind step 214, a layer of die attach film (DAF) adhered to a flexible dicing tape may be applied onto the second major surface 104 of the wafer 100 in step 216. The wafer 100 may then be turned over and supported on a chuck or other support surface, and the lamination tape on the first major surface 102 of the wafer 100 may be removed in step 218. Once on the chuck, the flexible dicing tape may be stretched along orthogonal axes to separate the individual semiconductor die 106 in step 220 to allow the individual semiconductor die 106 to be removed by a pick and place robot for inclusion in a semiconductor package. It is conceivable that the die 106 are not fully diced at completion of the backgrind step 214. In this event, stretching of the dicing tape in step 220 will complete dicing of the semiconductor die along the dicing lines 114.

Figure 14:
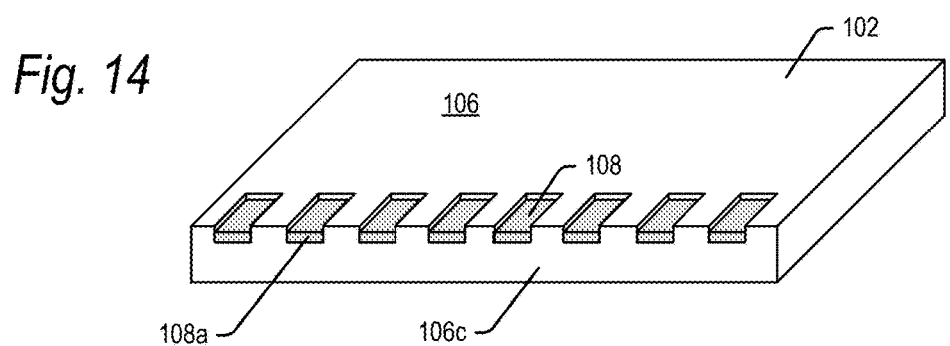
FIG. 14 illustrates a finished semiconductor die including die with edge bond pads according to a first embodiment of the present technology.
Figure 15:
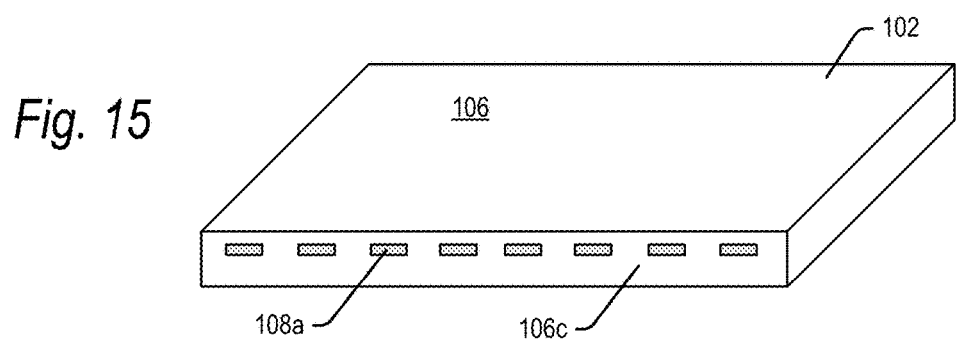
FIG. 15 illustrates a finished semiconductor die including die with edge bond pads according to an alternative embodiment of the present technology.

FIG. 14 shows a semiconductor die 106 after separation from wafer 100. The die 106 includes die bond pads 108 at a major surface 102 of the die 106, and the edges 108a of the die bond pads 108 exposed at an edge 106c of the semiconductor die 106. FIG. 15 shows the die bond pads 108 beneath the major surface 102 of the die 106, and the edges 108a of the die bond pads 108 exposed at the edge 106c of the semiconductor die 106.

Figure 16:
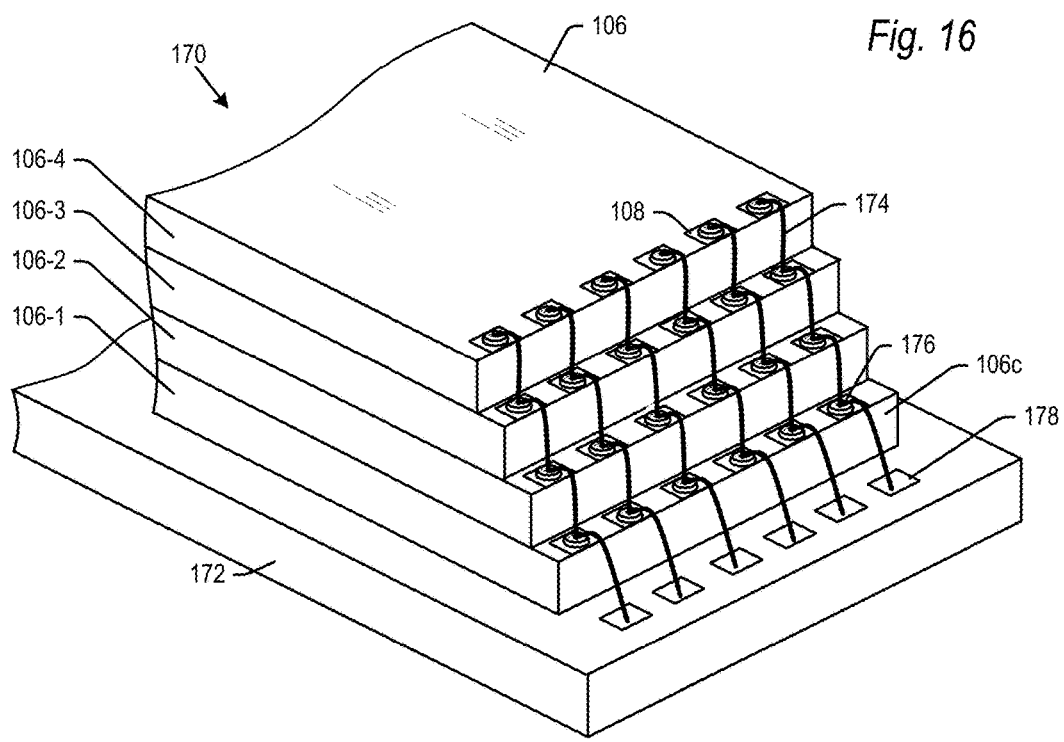
FIGS. 16 and 17 are perspective and cross-sectional edge views of a semiconductor package including semiconductor die according to embodiments of the present technology.
Figure 17:
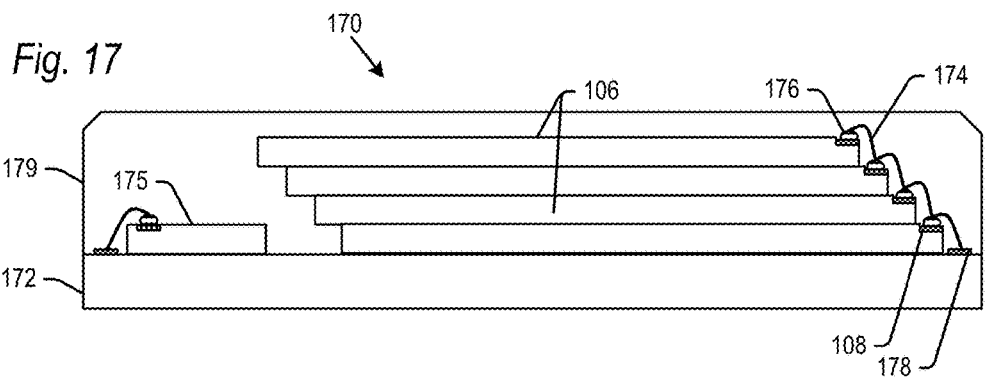

FIGS. 16 and 17 are perspective and cross-sectional edge views of the semiconductor package 170 including semiconductor die 106 with die bond pads 108 at the edge 106a fabricated according to embodiments described above. This embodiment may use any of the semiconductor die shown for example in FIGS. 4-9. FIGS. 16 and 17 show a number of semiconductor die 106 wire bonded to each other and a substrate 172. While four semiconductor die 106 are shown, it is understood that package 170 may include various numbers of semiconductor die including for example 2, 4, 8, 16, 32 and 64 semiconductor die. Package 170 may include other numbers of semiconductor die in further embodiments.

The semiconductor die 106 may be physically mounted to each other and the substrate 172 via the DAF on the bottom surface of each of the semiconductor die. Semiconductor die 106 are electrically coupled to each other in the substrate 172 via wire bonds 174 (one of which is numbered in each of FIGS. 16 and 17). Wire bonds 174 may be formed according to a number of schemes. However, in one embodiment, a wire bond capillary (not shown) forms a ball bump 176 on a first die bond pad 108 of a first die 106-1. From there, the wire bond capillary pays out wire and forms a stitch bond on a contact pad 178 of substrate 172. The wire bond capillary may then break the wire, move up to the first die bond pad of a second die 106-2, and form a ball bump 176. From there, the wire bond capillary pays out wire and forms a stitch bond on top of the ball bump 176 on the first die bond pad of die 106-1. This process continues up the die stack until the first die bond pads 108 on die 106-1, 106-2, 106-3 and 106-4 are wire bonded to each other and substrate 172. This process is then repeated for each of the die bond pads across the die 106 in the package 170. As noted, wire bonds 174 may be formed by other methods in further embodiments.

Upon completion of the wire bonds and fabrication of the package 170, the die bond pads 108 may transfer signals to and from the integrated circuits 120 within die 106 via the bond wires 174. The semiconductor package 170 shown in FIGS. 16 and 17 may further include a controller die 175, such as an ASIC, wire bonded to the substrate 172 for controlling the semiconductor die 106 as shown in FIG. 17. The package 170 may be completed by encapsulating the semiconductor die and wire bonds in a mold compound 179 as shown in FIG. 17.

It is a further feature of the technology that each die may be stacked with a small spacing from the die bond pads on the die below. For example, the die 106-2 may be stacked 0 to 5 µm away from the row of die bond pads 108 on the die 106-1. This spacing may be greater than that in further embodiments. Conventionally, there has been a larger space between the die bond pads and the die mounted thereon, such as for example 60 µm. Reducing this space further allows a reduction in the die overlap and overall footprint of the die stack.

In accordance with an aspect of the present technology, the die 106 with bonds pads 108 at the edge allow the die to be stacked with an offset with respect to each other that is smaller than conventional semiconductor die having the bond pads spaced from the proximal edge. For example, by providing the die bond pads 108 at the edge 106c of the semiconductor die 106-1, the die 106-2 may be mounted closer to the edge 106c of semiconductor die 106-1, resulting in a smaller offset between semiconductor die 106-1 and 106-2. This smaller offset compounds for each semiconductor die in the package 170, resulting in significant offset and space reductions in packages having large numbers of die. For example, conventional die bond pads may be formed 100 µm to 120 µm from the die edge. Thus, the offset of each die may be reduced by, for example, 100 µm to 120 µm. Additionally, in a die stack including for example 16 semiconductor die, the overall footprint of the offset die stack may be reduced by 1.6 mm to 1.9 mm. In addition to a reduction in the footprint of the die stack, the smaller offset reduces or eliminates the problem of die warping described in the Background section.

Figure 18:
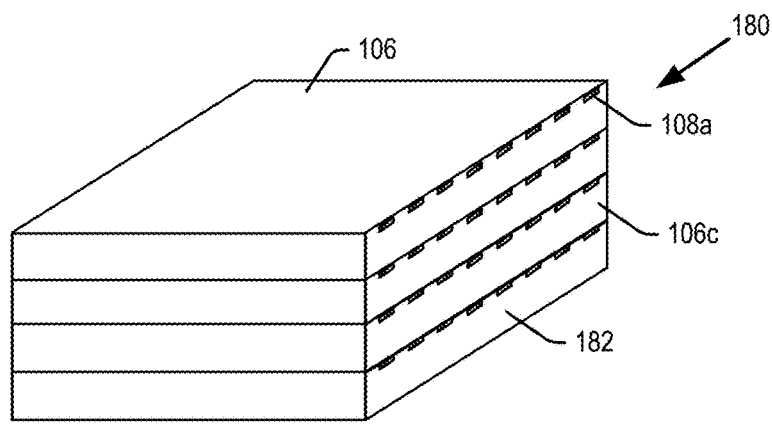
FIGS. 18-20 are perspective views of a semiconductor package including semiconductor die according to alternative embodiments of the present technology.
Figure 19:
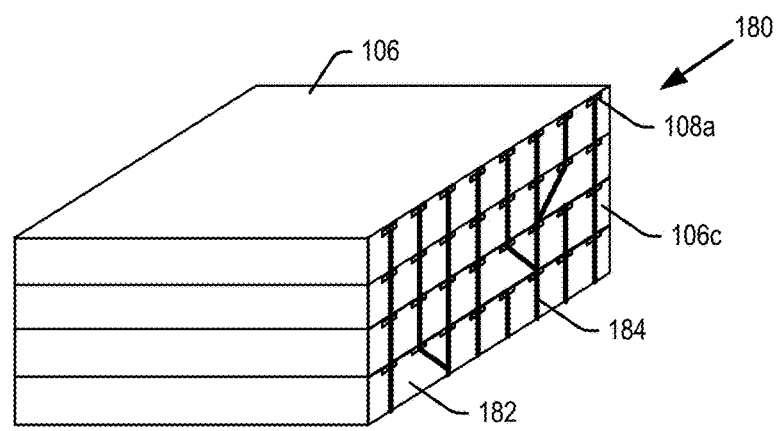
Figure 20:
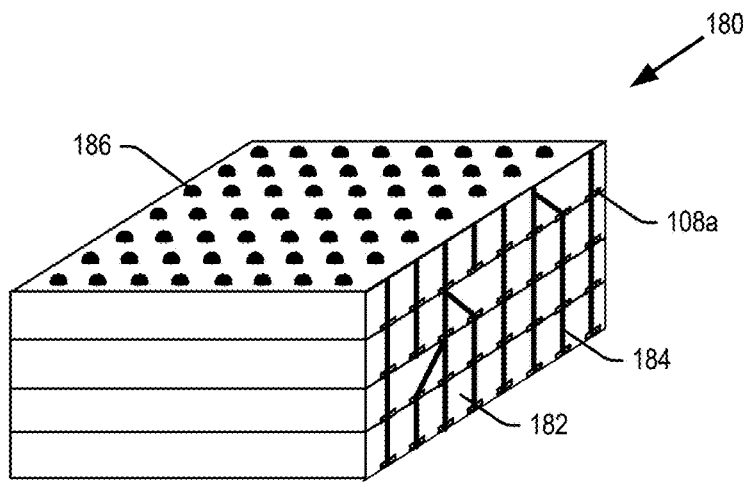

FIGS. 18-20 are perspective views of a semiconductor package 180 fabricated according to embodiments described above and including semiconductor die 106 with die bond pads 108 at an edge of the die. This embodiment may use any of the semiconductor die shown for example in FIGS. 4-11. FIGS. 18-20 show a number of semiconductor die 106 stacked substantially in a cube, with no offset from each other, forming for example a chip-scale package. While four semiconductor die 106 are shown, it is understood that package 180 may include various numbers of semiconductor die including for example 2, 4, 8, 16, 32 and 64 semiconductor die. Package 180 may include other numbers of semiconductor die in further embodiments. In the embodiment of FIGS. 18-20, the die edges 106c may be stacked to form a planar surface 182, with bond pad edges 108a exposed at the surface 182.

As shown in FIG. 19, a conductance pattern of electrical traces 184 may be formed on the planar surface 182, connecting select ones of bond pad edges 108a to each other. In one embodiment, in order to form the electrical traces 184, a layer of electrical insulation such as silicon dioxide may be sputtered onto the planar surface 182 to prevent electrical short of the electrical traces 184 against the semiconductor die 106. The electrical insulator layer may be processed for example by laser or chemical etch to expose the die bond edges 108a in the planar surface 182. The electrical traces 184 may then be applied over the insulator layer, for example by printing, sputtering or photolithographic processes. The conductive traces may for example be formed of titanium, nickel, copper or stainless steel formed on the insulator layer, but other conductive materials may be used in further embodiments. The specific conductance pattern shown in FIG. 18 is by way of example only, and may vary in further embodiments.

Referring to the bottom view of FIG. 20, external electrical connectors 186 (one of which is numbered in FIG. 20) may be applied to the bottom surface of the semiconductor package 180 to form a completed package. For example, where the semiconductor device 180 is to be soldered onto a motherboard of a host device as a BGA package, the external electrical connectors may be solder balls affixed to redistribution pads (or other contact pads) on a bottom surface of the semiconductor package 180. The redistribution pads may connect the electrical traces 184 to select ones of the external electrical connectors 186.

In summary, an example of the present technology relates to a semiconductor wafer comprising: a first major surface; a second major surface opposed to the first major surface; a plurality of semiconductor die comprising integrated circuits formed in the first major surface of the wafer; a kerf area comprising first and second sets of kerf lines, the first and second sets of kerf lines providing designated areas within which semiconductor die of the plurality of semiconductor die are separated from each other along dicing lines; and a plurality of die bond pads, the die bond pads comprising at least a portion extending into the first set of kerf lines and across a dicing line of the dicing lines.

In a further example, the present technology relates to a semiconductor die formed from a semiconductor wafer, the semiconductor die comprising: a first major surface; a second major surface opposed to the first major surface; integrated circuits formed adjacent the first major surface within an active area; and a plurality of die bond pads formed at least partially outside the active area.

In a further example, the present technology relates to a semiconductor package, comprising: a substrate; a plurality of stacked memory die mounted to the substrate, a semiconductor die of the stacked memory die comprising: integrated circuits formed adjacent the first major surface within an active area, a plurality of die bond pads formed at least partially outside the active area and having severed edges at an edge of the semiconductor die outside of the active area; and a controller die electrically connected to the stacked memory die for controlling the transfer of data to and from the stacked memory die.

In another example, the present technology relates to a semiconductor die formed from a semiconductor wafer, the semiconductor die comprising: a first major surface; a second major surface opposed to the first major surface; integrated circuits formed adjacent the first major surface within an active area; and pad means for transferring signals to and from the integrated circuits, the pad means having severed edges at an edge of the semiconductor die.

In a further example, the present technology relates to a semiconductor die formed from a semiconductor wafer, the semiconductor die comprising: a first major surface; a second major surface opposed to the first major surface; integrated circuits located within the first major surface; and a plurality of die bond pads having severed edges at an edge of the semiconductor die.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A semiconductor wafer comprising:
   a first major surface;
   a second major surface opposed to the first major surface;
   a plurality of semiconductor die comprising integrated circuits formed in the first major surface of the wafer;
   a kerf area comprising first and second sets of kerf lines, the first and second sets of kerf lines providing designated areas within which semiconductor die of the plurality of semiconductor die are separated from each other along dicing lines; and
   a plurality of die bond pads, formed in the first major surface and electrically coupled to the integrated circuits, the die bond pads comprising at least a portion extending into the first set of kerf lines and across a dicing line of the dicing lines.

2. The semiconductor wafer of claim 1, wherein the plurality of die bond pads are formed entirely within the first set of kerf lines.

3. The semiconductor wafer of claim 1, wherein the plurality of die bond pads are formed partially within the first set of kerf lines.

4. The semiconductor wafer of claim 1, wherein the plurality of die bond pads are exposed at the first major surface of the semiconductor wafer.

5. The semiconductor wafer of claim 1, wherein the plurality of die bond pads are concealed beneath the first major surface of the wafer.

6. The semiconductor wafer of claim 1, wherein the plurality of die bond pads are positioned over a seal ring formed beneath a surface of the semiconductor wafer.

7. A semiconductor die formed from a semiconductor wafer, the semiconductor die comprising:
   a first major surface;
   a second major surface opposed to the first major surface;

integrated circuits formed adjacent the first major surface within an active area; and a plurality of die bond pads formed in the first major surface, at least partially outside the active area, the plurality of bond pads severed along an edge when the semiconductor die is diced from the semiconductor wafer.

8. The semiconductor die of claim 7, wherein the plurality of die bond pads are formed entirely outside of the active area.

9. The semiconductor die of claim 7, wherein the plurality of die bond pads are visible at the first major surface of the semiconductor die.

10. The semiconductor die of claim 7, wherein the plurality of die bond pads are visible at the edge of the semiconductor die and concealed beneath the first major surface of the semiconductor die.

11. The semiconductor die of claim 7, wherein the plurality of die bond pads are positioned over a seal ring formed beneath a surface of the semiconductor wafer.

12. The semiconductor die of claim 11, further comprising metal interconnects for electrically connecting the plurality of die bond pads to the integrated circuits, the metal interconnects positioned between the seal ring and the first major surface of the semiconductor die.

13. The semiconductor die of claim 11, further comprising metal interconnects for electrically connecting the plurality of die bond pads to the integrated circuits, the metal interconnects positioned between the seal ring and the second major surface of the semiconductor die.

14. The semiconductor die of claim 7, wherein the integrated circuits are integrated circuits for flash memory.

15. A semiconductor package, comprising:
a substrate;
a plurality of stacked memory die mounted to the substrate, a semiconductor die of the stacked memory die comprising:
integrated circuits formed adjacent a first major surface within an active area,
a plurality of die bond pads formed in the first major surface at least partially outside the active area and having severed edges at an edge of the semiconductor die outside of the active area; and
a controller die electrically connected to the stacked memory die for controlling the transfer of data to and from the stacked memory die.

16. The semiconductor package of claim 15, wherein the plurality of stacked memory die are stacked in an offset configuration.

17. The semiconductor package of claim 16, wherein the die bond pads at the edge of the semiconductor die enable a reduction in the amount of offset of the semiconductor die in comparison to a stack of semiconductor die including die bond pads spaced from the edge.

18. The semiconductor package of claim 16, further comprising wire bonds for electrically connecting the plurality of stacked memory die with each other and the substrate.

19. A semiconductor die formed from a semiconductor wafer, the semiconductor die comprising:
a first major surface;
a second major surface opposed to the first major surface;
integrated circuits formed adjacent the first major surface within an active area; and
pad means, formed in the first major surface, for transferring signals to and from the integrated circuits, the pad means having severed edges at an edge of the semiconductor die.

20. The semiconductor die of claim 19, wherein the pad means enable a reduction in the amount of offset of the semiconductor die in comparison to a stack of semiconductor die including die bond pads spaced from the edge.

21. A semiconductor die formed from a semiconductor wafer, the semiconductor die comprising:
a first major surface;
a second major surface opposed to the first major surface;
integrated circuits located within the first major surface; and
a plurality of die bond pads, formed in the first major surface, having severed edges at an edge of the semiconductor die.

22. The semiconductor die of claim 21, wherein the plurality of die bond pads are visible at the first major surface of the semiconductor die.

23. The semiconductor die of claim 21, wherein the plurality of die bond pads are visible at the edge of the semiconductor die and concealed beneath the first major surface of the semiconductor die.

24. The semiconductor die of claim 21, wherein the integrated circuits are integrated circuits for flash memory.

* * * * *